(12) United States Patent  
Kane et al.

(10) Patent No.: US 6,733,306 B2  
(45) Date of Patent: May 11, 2004

(54) ELECTRONIC MODULE ASSEMBLY APPARATUS, METHODS AND ARTICLES OF MANUFACTURE

(75) Inventors: Vincent M. Kane, Harrisburg, PA (US); Keith R. Foltz, Oberlin, PA (US)

(73) Assignee: Tyco Electronics Corporation, Middletown, PA (US)

( * ) Notice: Subject to any disclaimer, the term of this patent is extended or adjusted under 35 U.S.C. 154(b) by 169 days.

(21) Appl. No.: 10/087,580

(22) Filed: Feb. 28, 2002

(65) Prior Publication Data

US 2003/0161127 A1 Aug. 28, 2003

(51) Int. Cl.[7] .............................................. H01R 12/20
(52) U.S. Cl. ....................................................... 439/79
(58) Field of Search .................................. 439/79, 76.1

(56) References Cited

U.S. PATENT DOCUMENTS

| | | | | |
|---|---|---|---|---|
| 5,688,129 A | * | 11/1997 | Flaherty ....................... | 439/79 |
| 5,931,687 A | * | 8/1999 | McFarlane et al. ........... | 439/79 |
| 6,093,033 A | * | 7/2000 | Kuki et al. .................... | 439/79 |
| 6,227,874 B1 | * | 5/2001 | Yu ................................ | 439/79 |

* cited by examiner

Primary Examiner—Gary F. Paumen

(57) ABSTRACT

Apparatus, methods and articles of manufacture for electronic module assemblies are shown, comprising a pin organizer installed after a header is assembled to a module. Opposing forces tension the organizer, header and module assembly, so as to provide a relatively fixed anchor for the header upon the module, as well as providing orientation for the module and support for a pin array.

7 Claims, 7 Drawing Sheets

ELECTRONIC MODULE ASSEMBLY APPARATUS, METHODS AND ARTICLES OF MANUFACTURE

FIELD OF THE INVENTION

The present invention generally relates to apparatus, methods and articles of manufacture for electronic module assemblies. More particularly, the present invention relates to electronic module assemblies with right angle pins that are installed on Printed Circuit Boards.

BACKGROUND OF THE INVENTION

The assembly of electronic modules components is often done through headers mounted in modules, also known as castings. The header is itself assembled with electrical connection hardware comprising right angle pins. The header, once assembled with right angle pins, is then mounted to a module through an opening in the module. The module contains a second opening from which the right angle pin tails extend, once the header is installed. The header—module assembly (or "module assembly") is then mounted to a Printed Circuit Board ("PCB") and the pin tails are received by corresponding holes in the PCB, thus providing an electrical connection between the header and PCB.

The assembly of header to module must be done with care. The pins cannot be inadvertently bent as the header is installed in the module. Moreover, the header should be placed on the module and fixed in the module with care. Careless header—module assembly may result in the pins being misaligned and therefore their tails being unable to be subsequently mounted within the corresponding holes in the PCB.

A header is usually fixed in a module through some permanent fixation means, done with glue or other sealant. This permanent fixation process needs to be done with some care. Otherwise, shifting, movement, etc. during the process may disturb the pin array and thus disrupt pin integrity.

In the art of header—module assembly, pin organizers have been used to maintain pin integrity during the header—module assembly process, as well as support the pins in subsequent module—PCB installation. These pin organizers are installed as the header is being fitted with pins. However, pin organizers installed before header—module installation may complicate the header—module installation process, because there is little room to operate when installing headers with pins into modules or castings. The module's opening, within which the header fits, may be too small to receive an organizer installed on the pins. Thus, a pin organizer, if added before the header is inserted, may require that the header opening be enlarged. However, this enlargement may result in undesirable space in the header—module interface.

Nor do preinstalled (i.e., installed before header—module installation) pin organizers necessarily provide any ability to maintain header positioning within the module before or during the permanent fixation process. Thus affects on header orientation such as shifting or other disorientation of the header may occur, with undesirable consequences when the header—module assembly is attempted to be mounted upon a PCB.

A preinstalled pin organizer may also take up necessary room as the header is being assembled to the module. For example, for headers that are glued or bonded to castings or modules, the organizer could potentially interfere with the bond that is being created.

Thus the art has tried to various methods to maintain header—module positioning and pin integrity as headers are mounted to modules. Clips, screws and the like have been tried. But these may add components, increase the size of the modules, or add manufacturing complexity to the device.

Accordingly, it would be extremely beneficial if a small easy to operate pin organizer could be used to assist in module assembly.

Therefore, it is an object of the present invention to provide a small, easy to operate pin organizer to assist in module assembly.

It is a further object of the present invention to provide a small, easy to operate pin organizer to assist in maintaining pin integrity during module assembly.

It is a further object of the present invention to provide a small, easy to operate pin organizer to assist in maintaining header orientation during module assembly.

SUMMARY OF THE INVENTION

The summary, as well as the following detailed description of the invention, will be better understood when read in conjunction with the appended drawings. For the purpose of illustrating the invention, there are shown in the drawings, certain embodiment(s) which are presently preferred. It should be understood, however, that the invention is not limited to the precise arrangements and instrumentalities shown.

Preferred embodiments of the present invention comprise a pin organizer installed after a header is assembled to a module. The pin organizer is installed over a pin array on the header after the header is installed on the module. The organizer, through contact with the header as well as module, provides a relatively fixed anchor for the header either prior to permanent header fixation or instead of permanent header fixation. The organizer further provides support for the pin array during module assembly, as well as during module installation upon a PCB.

Additional objects, advantages and novel features of the invention will be set forth in part in the description and figures which follow, and in part will become apparent to those skilled in the art on examination of the following, or may be learned by practice of the invention.

DETAILED DESCRIPTION OF THE PREFERRED EMBODIMENTS

Reference is now made to the accompanying Figures for the purpose of describing, in detail, the preferred embodiments of the present invention. The Figures and accompanying detailed description are provided as examples and are not intended to limit the scope of the claims appended hereto.

Figure 1:
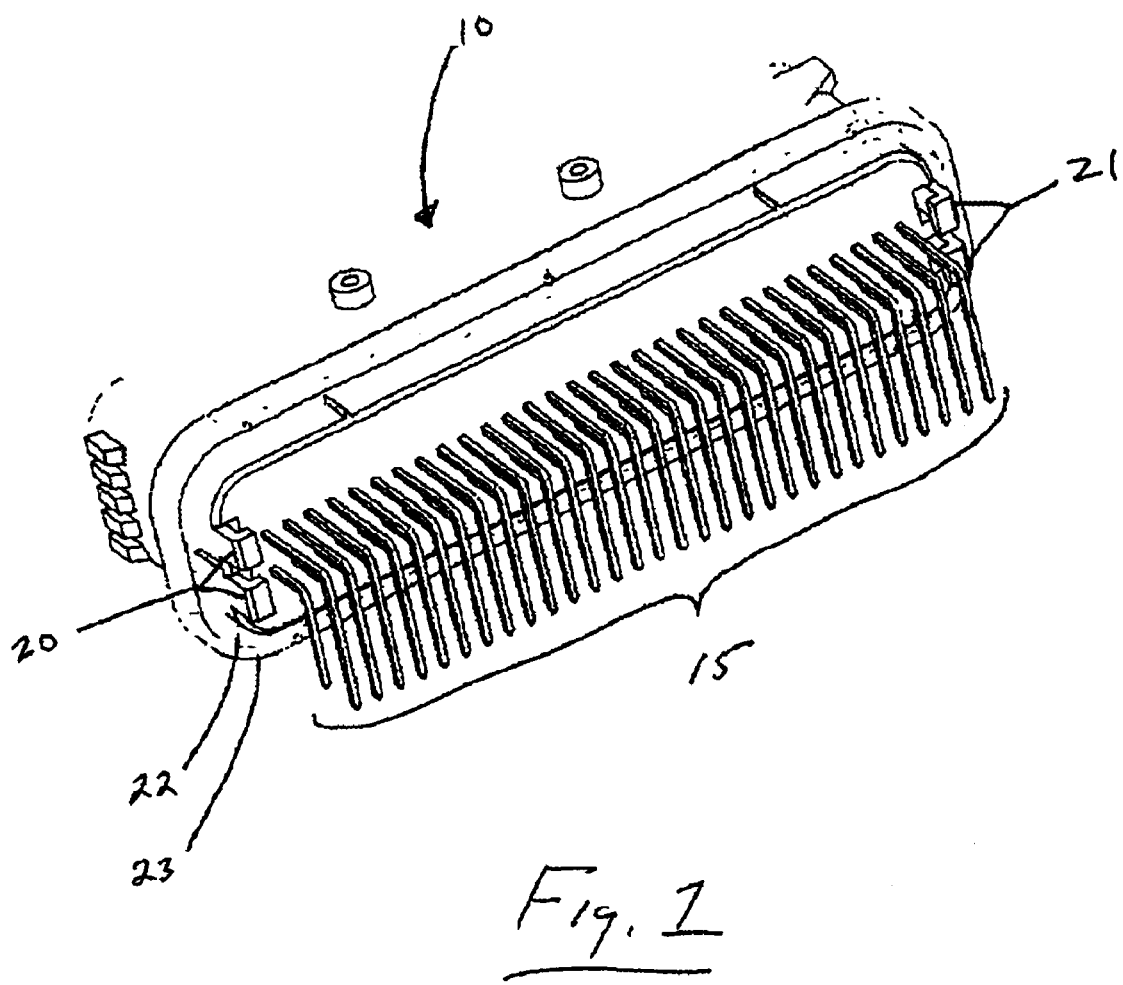
FIG. 1 shows a view of a preferred embodiment.

FIG. 1 shows a header 10, which is a component of the preferred embodiments of the present invention. Right angle pin array 15 depends from header 10. Also seen are fingers 20 and 21, which retain an organizer, as further described below. Channel 22 and ridge 23 provide for connection to a module, as will be further described below.

Figure 2:
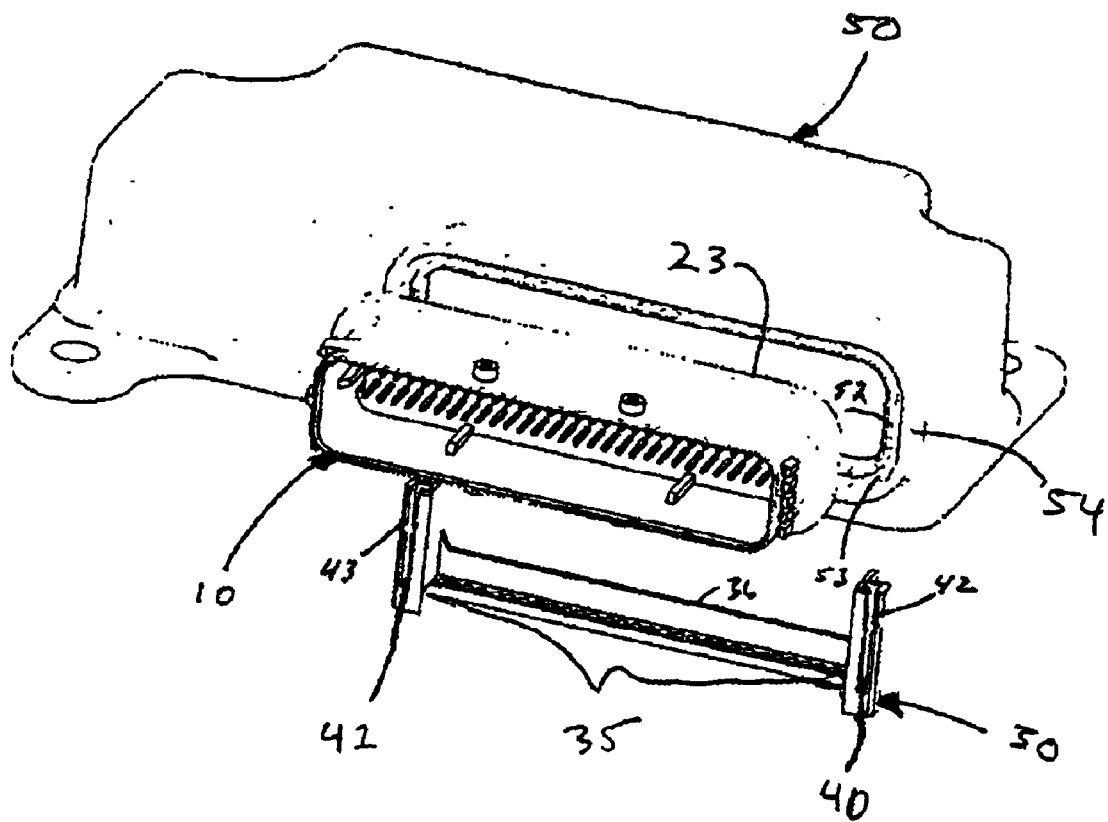
FIG. 2 shows another view of the embodiment of FIG. 1.

Turning now to FIG. 2, header 10, organizer 30 and module 50 are seen. Module 50 has ridge 52 which fits in mating alignment with channel 22 on connector 10 (shown in FIG. 1.) Ridge 23 fits within channel 53, and ridge 54 surrounds ridge 23 when the header and module are assembled.

Pin organizer 30 has pin conduits, shown generally at 35, which are disposed so as to be in mating relationship with a row of pins in pin array 15 of connector 10 (shown in FIG. 1.) Increased structural integrity in this embodiment is provided by ridge 36, which separates the pin rows of the pin array. Not shown here is another row of pin conduits, like those at 35, configured so as to in mating relationship with a second row of pin array 15. Of course, in other embodiments, pin conduits and ridges are displaced on the organizer as desired, generally to be in mating relationship with any pin array (which term as used herein includes any arrangement of more than one pin.) Additionally, in other embodiments, ridges extending from pin conduits may not be present, or reinforcement means other than ridges may be used.

Returning now to FIG. 2, channels 40 and 41 are displaced on organizer 30 so as to be in mating relationship with fingers 20 and 21 on header 10 (shown in FIG. 1.) Surfaces 42 and 43 are in mating relationship with inner surfaces of housing 50 and provide frictional contact with those inner surfaces to provide support for the permanent fixation process, as will be further described below. Locking tabs 44 and 45 will mate with tabs 24 and 25 on the header (shown in FIG. 1) and provide support for the installed connector, as well as assurance that the organizer is completely installed, as will be further described below.

Figure 3:
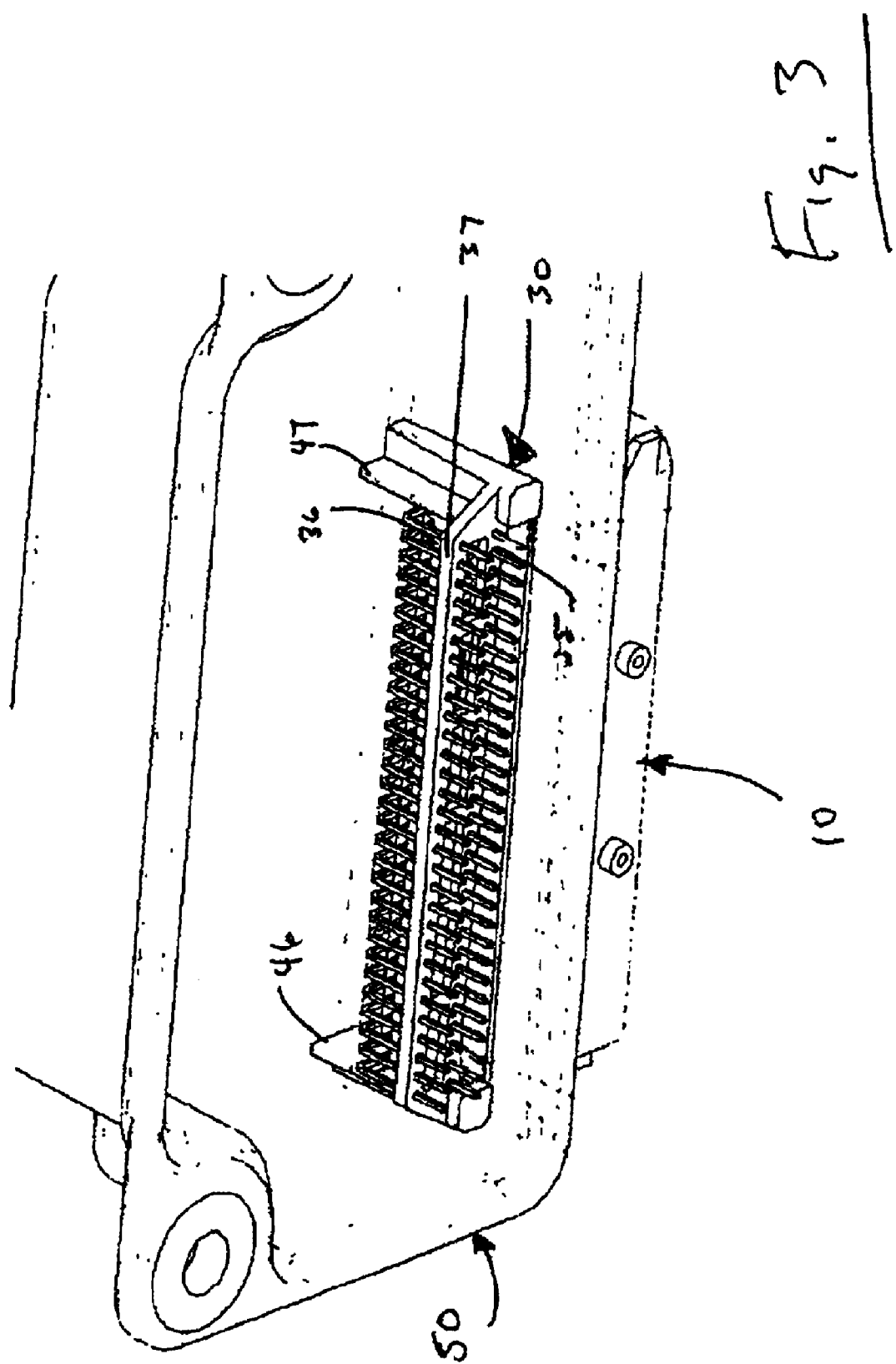
FIG. 3 shows another view of the embodiment of FIG. 1.

FIG. 3 shows header 10 and connector 30 installed within housing 50 (referred to herein as a "module assembly") from a bottom view of the housing. Surfaces 42 and 43 (not shown here; see FIG. 2) engage the housing's inner surfaces through frictional contact with the housing's inner surfaces. Fins 46 and 47 provide additional torsional support to the pin conduits 35 and 37 as well as to ridge 36, and lateral support to surfaces 42 and 43, thus ensuring their contact with inner surfaces of housing 50.

Figure 4:
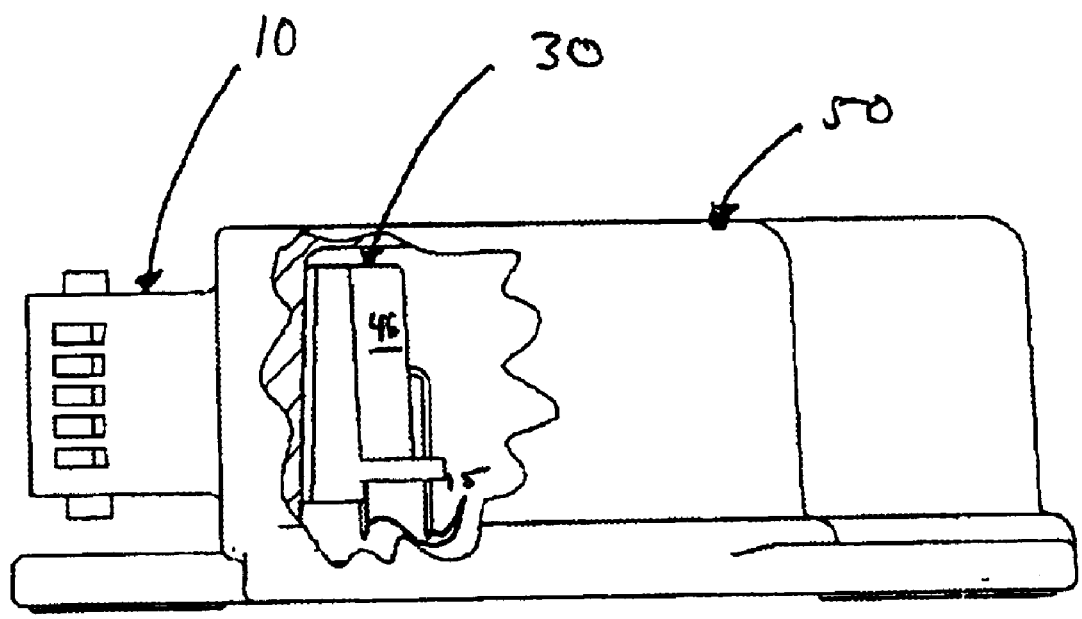
FIG. 4 shows a cutaway view of the embodiment of FIG. 1.

FIG. 4 shows, in cut away side view, header 10 and connector 30 installed within housing 50 of the preferred embodiments. Here header 10 has been installed within housing 50. Fin 46 of organizer 30 is seen, and pin array 15 is partially visible.

Figure 5:
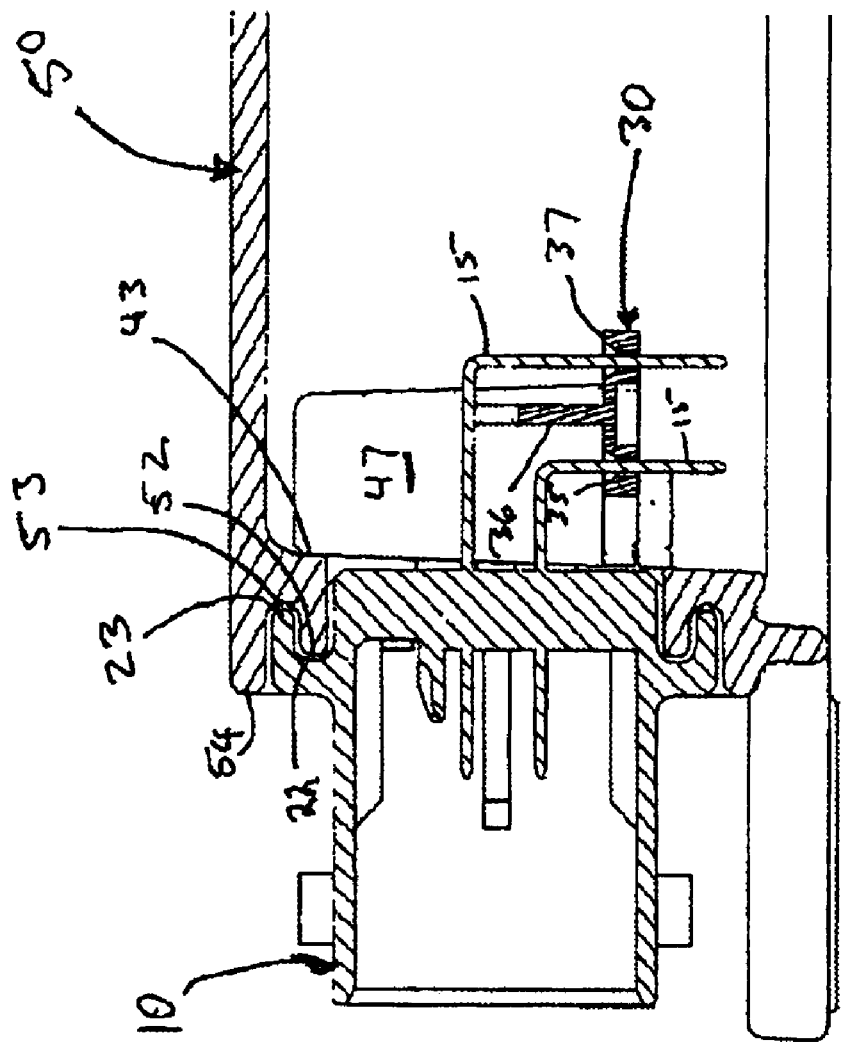
FIG. 5 shows a sectional view of the embodiment of FIG. 1.

FIG. 5 shows a partial sectional view from the same side as FIG. 4, taken from inside fin 46 looking toward fin 47. Header 10 mates with housing 50 through the interconnection of ridges 54, 52 and 23 and channels 22 and 53. If glue or other material is used to affix header 10, it may be applied here. The top of surface 43 is shown in frictional contact with an inner housing surface. Pin array 15 depends through appropriate conduits, here 35 and 37. Ridge 36, which is lower than the top shoulder of the rear pin row during the pin run, is shown as well.

Figure 6:
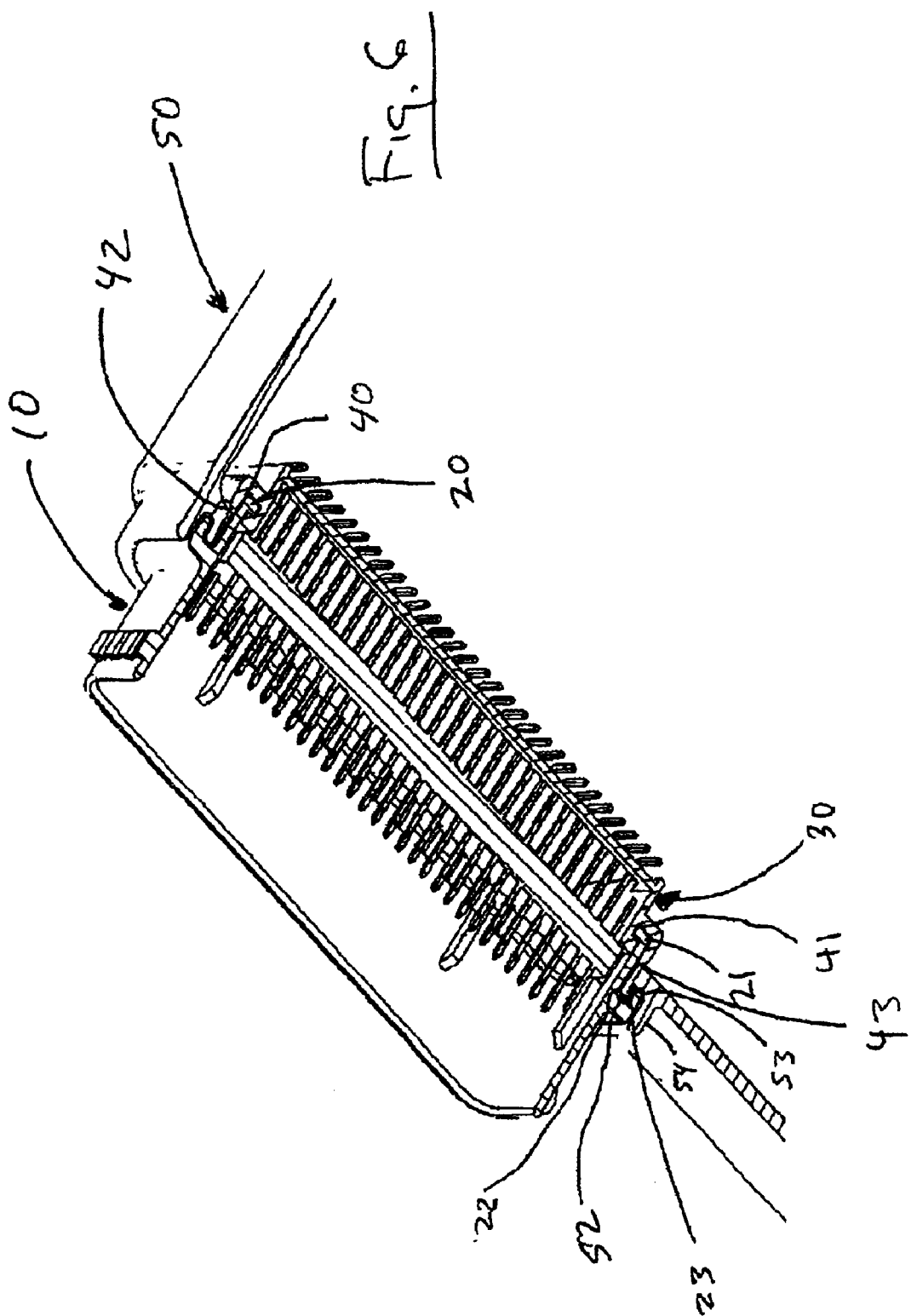
FIG. 6 shows a sectional view of the embodiment of FIG. 1.

FIG. 6 shows an underside sectional view, taken above pin conduits 35 and 37 on organizer 30. Here channels 40 and 41 on organizer 30 are shown in mating relationship with fingers 20 and 21 on header 10. The channel—finger arrangement provided a means for orienting the header. Thus, in this embodiment, orientation of the header is assured, that is, the header cannot be installed upside down as otherwise might be possible. Other embodiments might dispense with this arrangement, if orientation is not a concern, or might use a different means to assure orientation of the header. Of course, the channel—finger arrangement also provides a means for engaging the header to the organizer. Thus, in other embodiments, other means for engagement of the organizer to the header may be used, such as are known in the art.

Header 10 is retained on the housing 50 through tension between the opposing forces imposed by the outer interconnections of ridges 54, 52 and 23 and channels 22 and 53 and the inner connections of channels 40 and 41 with fingers 20 and 21; as well as through the frictional contact of surfaces 42 and 43 on the inner surface of housing 50.

It should be noted that, in other embodiments, other means may be used to supply desired tension between a header, module and organizer. For example, the channel—ridge arrangement may be reversed so that the organizer wedges to the header rather than the housing, thus imposing tension upon the assembly; the organizer may surround the ridges in both the header and the housing, so as to be affixed to both and thus impose tension on the assembly; the organizer can be interposed within fingers or other protrusions on the header and the housing, proving a hinge like tensioning mechanism, etc.

Figure 7:
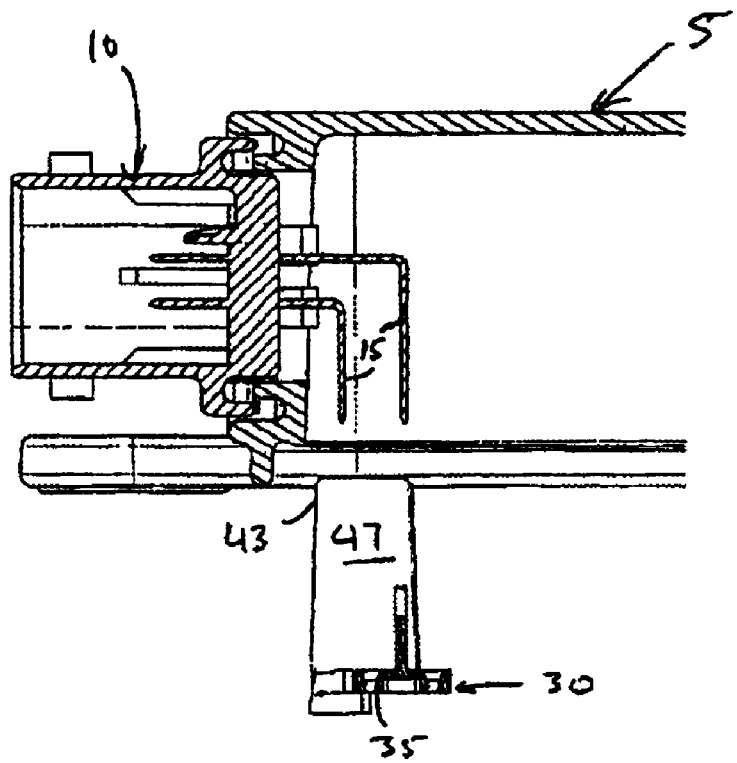
FIG. 7 shows a sectional view of the embodiment of FIG. 1.
Figure 8:
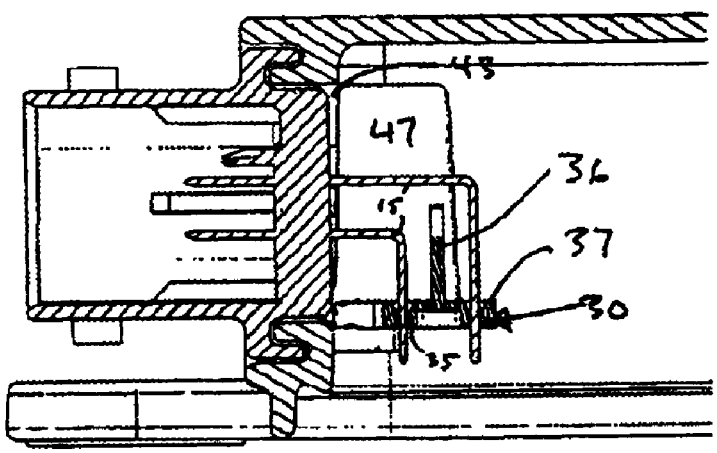
FIG. 8 shows a sectional view of the embodiment of FIG. 1.

In order to further understand the installation process for a module assembly of the preferred embodiments, it might be helpful to refer to FIGS. 7 and 8. FIG. 7, taken along the same sectional view as FIG. 5, shows organizer 30 prior to insertion in housing 50. Header 10 is not yet interconnected with housing 50 through ridges 54, 52 and 23 and channels 22 and 53. Header 10 is to be installed within the housing 50, and organizer 30 is to be brought up through the underside of the housing 50. FIG. 8, taken from the same view, shows organizer 30 being slid within housing 50. Pin array 15 depends through their respective pin conduits. Surface 43 is below its final placement on an inner surface of housing 50, but it is making contact with an inner surface of the housing as organizer 30 is being slid into place. The chamfered surface on surface 43, as well as surface 42, as best seen in FIG. 6, assists in providing horizontal seating of organizer 30 within the recess of housing 50, however, in other embodiments, the chamfer surface may not be desired.

The wedge shape of fin 47 (as well as corresponding fin 46) creates tension and provides increasing counter force as organizer 30 is slid into place, thus increasing the tension between opposing forces imposed by the outer interconnections of ridges 54, 52 and 23 and channels 22 and 53 and the inner interconnections of channels 40 and 41 with fingers 20 and 21. It should be noted, as well, that the frictional contact of surfaces 42 and 43 on inner surfaces of housing 50 provides further security for the assembly, as well as further securing the header into the housing, such as may be needed when glue or other sealant is applied in the various channels. The application of sealant might alter the distances of the various ridge-channel mating, and so the wedge provides further assurance of proper seating.

As was described above, in other embodiments, other means may be used to provide opposing tensions.

Additionally, the increased tension provided by the wedged surface may be interposed by other means, such as a slanted inner housing wall, etc. Nor may the increased tension until assembly, such as provided by the wedge in the preferred embodiments, or other means in other embodiments, be necessary for locking the assembly. Thus, certain embodiments may dispense with an increasing tension means entirely.

Thus a header can be mechanically attached using the preferred embodiments, while minimal space is required in any housing opening. For example, standard sized housing openings may be used—there is no need to increase the opening size to accommodate a preinstalled organizer. Thus tooling changes do not have to be made for a module assembly according to the preferred embodiments.

Moreover, the sealing area between the header and casting can be minimized by a module assembly as described above. Less surface area is required because of the additional forces imposed through the assembly. Additionally, a header is held to a module in a desired position until external bonding and sealing means such as glue or other means known in the art has set. It should be noted that use of an external sealing means may be dispensed with entirely, as well, in other embodiments, as the module assembly may be sufficiently stable for further use.

Lateral support for a pin array is also provided by a module assembly according to the preferred embodiments as the assembly is installed upon a PCB or similar device. So for example, when a module assembly with associated pin tails depending therefrom, is inserted upon a PCB, often by the application of force to the top and/or sides of a housing, the fixed positioning of the pins imposed by a conduit or conduits on an organizer, as well as the lateral retention force imposed on the pins by the channels, ridges and surfaces referred to above, assist in preventing spreading of the pin tails. Thus, pin integrity is preserved as a module is installed on a PCB.

The composition of the various components can be as known in the art as long as adequate structural rigidity and dielectric properties exist. So for example, a header in a preferred embodiments is constructed according to automotive specifications, e.g., glass filled PBT (polybutylene terephthalate) with varying glass content in the range of 15–35%; an organizer in the preferred embodiments is constructed of PBT with optional glass content and a housing is constructed according to industry standards for casting or die casting e.g., aluminum. Any glue or other sealant used is typically, two part silicone, two part epoxy, or heat cured epoxy.

The above description and the views and material depicted by the figures are for purposes of illustration only and are not intended to be, and should not be construed as, limitations on the invention.

Moreover, certain modifications or alternatives may suggest themselves to those skilled in the art upon reading of this specification, all of which are intended to be within the spirit and scope of the present invention as defined in the attached claims.

We claim:

1. A module assembly apparatus comprising:

header means with a pin array depending from said header;

pin organizer means, further comprised of: pin conduit means disposed to be in mating relationship with said pin array; means for engaging said pin organizer means to said header means; and, means for engaging said pin organizer means to a housing means;

and said housing means;

wherein, said pin conduit means mates with said pin array, said means for engaging said pin organizer means to said header means engages said header means, and said means for engaging said pin organizer means to a housing means engages said housing means.

2. An apparatus as in claim 1 wherein said means for engaging said pin organizer Means to a header means further comprises a channel means disposed upon said pin organizer means.

3. An apparatus as in claim 1 wherein said means for engaging said pin organizer means to a header means further comprises a means for orienting said pin organizer means.

4. An apparatus as in claim 1 wherein said means for engaging said pin organizer means to said header means further comprises a finger means.

5. An apparatus as in claim 1 wherein said means for engaging said pin organizer means to a housing means further comprises a surface means.

6. An apparatus as in claim 5 wherein said surface means further comprises a wedge shaped surface means.

7. An apparatus as in claim 1 further comprising means for orienting said header means through engagement with said pin organizer means.

* * * * *